(12) United States Patent
Pawlowski et al.

(10) Patent No.: US 7,601,482 B2
(45) Date of Patent: Oct. 13, 2009

(54) NEGATIVE PHOTORESIST COMPOSITIONS

(75) Inventors: Georg Pawlowski, Bridgewater, NJ (US); Chunwei Chen, Piscataway, NJ (US); Joseph Oberlander, Phillipsburg, NJ (US); Robert Plass, Belleville, NJ (US)

(73) Assignee: AZ Electronic Materials USA Corp., Somerville, NJ (US)

( * ) Notice: Subject to any disclaimer, the term of this patent is extended or adjusted under 35 U.S.C. 154(b) by 0 days.

(21) Appl. No.: 11/390,716

(22) Filed: Mar. 28, 2006

(65) Prior Publication Data

US 2007/0231735 A1 Oct. 4, 2007

(51) Int. Cl.
G03F 7/033 (2006.01)
G03F 7/028 (2006.01)
G03F 7/031 (2006.01)
G03F 7/30 (2006.01)

(52) U.S. Cl. .................. 430/285.1; 430/325; 430/905; 430/910; 430/916; 430/914

(58) Field of Classification Search ................. None
See application file for complete search history.

(56) References Cited

U.S. PATENT DOCUMENTS

| | | | |
|---|---|---|---|
| 3,474,054 A | 10/1969 | White | |
| 3,757,013 A * | 9/1973 | Bickel | ............... 540/228 |
| 3,784,557 A | 1/1974 | Cescon | |
| 3,870,663 A * | 3/1975 | Clemens et al. | ........... 521/147 |
| 4,200,729 A | 4/1980 | Calbo | |
| 4,251,665 A | 2/1981 | Calbo | |
| 4,252,887 A | 2/1981 | Dessauer | |
| 4,311,783 A | 1/1982 | Dessauer | |
| 4,410,621 A | 10/1983 | Wada et al. | |
| 4,459,349 A | 7/1984 | Tanaka et al. | |
| 4,622,286 A | 11/1986 | Sheets | |
| 5,187,019 A | 2/1993 | Calbo et al. | |
| 5,419,998 A * | 5/1995 | Mayes et al. | ........... 430/288.1 |
| 6,017,974 A * | 1/2000 | Hosokawa et al. | ............ 522/99 |
| 6,210,846 B1 * | 4/2001 | Rangarajan et al. | .......... 430/30 |
| 6,653,425 B1 * | 11/2003 | Armstrong-Poston et al. | ........................ 526/289 |
| 6,824,947 B2 | 11/2004 | Ishizuka et al. | |
| 6,844,136 B1 | 1/2005 | Lifka et al. | |
| 6,919,159 B2 | 7/2005 | Matsumoto et al. | |
| 2001/0044075 A1 * | 11/2001 | Nishimura et al. | ....... 430/285.1 |
| 2002/0061464 A1 | 5/2002 | Aoal et al. | |
| 2003/0087189 A1 * | 5/2003 | Takagi et al. | ............ 430/280.1 |
| 2003/0235782 A1 | 12/2003 | Padmanaban et al. | |
| 2004/0007037 A1 | 1/2004 | Yoshino et al. | |
| 2004/0142280 A1 | 7/2004 | Iwanaga et al. | |
| 2004/0152013 A1 * | 8/2004 | Olson et al. | ............ 430/270.11 |
| 2004/0229155 A1 | 11/2004 | Rahman et al. | |
| 2004/0265733 A1 | 12/2004 | Houlihan et al. | |
| 2005/0019705 A1 | 1/2005 | Thackeray et al. | |
| 2005/0182148 A1 * | 8/2005 | Gaud et al. | ..................... 522/1 |
| 2005/0271974 A1 | 12/2005 | Rahman et al. | |
| 2006/0009579 A1 * | 1/2006 | Miyawaki et al. | ............. 525/31 |

FOREIGN PATENT DOCUMENTS

| | | |
|---|---|---|
| EP | 0 935 171 A1 | 8/1999 |
| JP | 61016521 A * | 1/1986 |
| JP | 2002-229208 A | 8/2002 |
| KR | 10-2005-0000464 A | 1/2005 |

OTHER PUBLICATIONS

RN 25067-05-4 from STN database Registry file, ACS in STN, copyright 2007, 2 pages.*
Yamao et al , AN 1986:234321, CAPLUS file of ACS on STN, entered Jun. 27, 1986, English abstract of JP 61-016521 A, one page.*
Aronix , http://www.toagosei.net/Products/Acrylic/ Acrylic_Polymer/Aronix/aronix.htm, one page copyrign 1998, Toagosei America, inc, two pages.*
PTO 08-2472, Translation of JP 2002-229208 A even though improperly identified as JP 02-229208 A, 25 pages, dated Feb. 2008 and translated by FLS, Inc, for United STates Patent and Trademark OFfice.*

(Continued)

*Primary Examiner*—Cynthia Hamilton
(74) *Attorney, Agent, or Firm*—Sangya Jain

(57) ABSTRACT

The present invention relates to a negative photoresist composition comprising, a) at least one alkali-soluble polymer, where the polymer comprises at least one unit of structure 1,

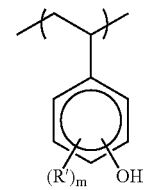

(1)

where, R' is selected independently from hydrogen, $(C_1-C_4)$ alkyl, chlorine, bromine and m is an integer from 1 to 4; b) at least one monomer of structure 1,

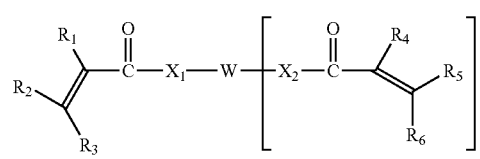

(4)

where, W is a multivalent linking group, $R_1$ to $R_6$ are independently selected from hydrogen, hydroxyl, $(C_1-C_{20})$ alkyl and chlorine, $X_1$ and $X_2$ are independently oxygen or $N-R_7$, where $R_7$ is hydrogen or $(C_1-C_{20})$ alkyl, and n is and integer equal to or greater than 1, and c) at least one photoinitiator. The invention also relates to a process for imaging the negative photoresist composition.

23 Claims, 1 Drawing Sheet

OTHER PUBLICATIONS

English Language Abstract of KR 2005000464-A.

T. Yamaoka et al., "Dual-mode Behavior of Vinyl Ether Functionalized Photoresist", Journal of Photopolymer Science and Technology, vol. 7, No. 3, pp. 533-pp. 536 (1994).

Notification of Transmittal of the International Search Report and the Written Opinion of the International Searching Authority, or the Declaration (Form PCT/ISA/220), International Search Report (Form PCT/ISA/210), and Written Opinion of the International Searching Authority (Form PCT/ISA/237) for PCT/IB007/000899.

English Language Abstract of JP 2002-229208 A.

Notification of Concerning Transmittal of Copy International Preliminary Report on Patentability (Chapter I of the Patent Cooperation Treaty) (Form PCT/IIB/326) and International Preliminary Report on Patentability (Form PCT/IB/373) for PCT/IB2007/000899, no date of publication given.

* cited by examiner

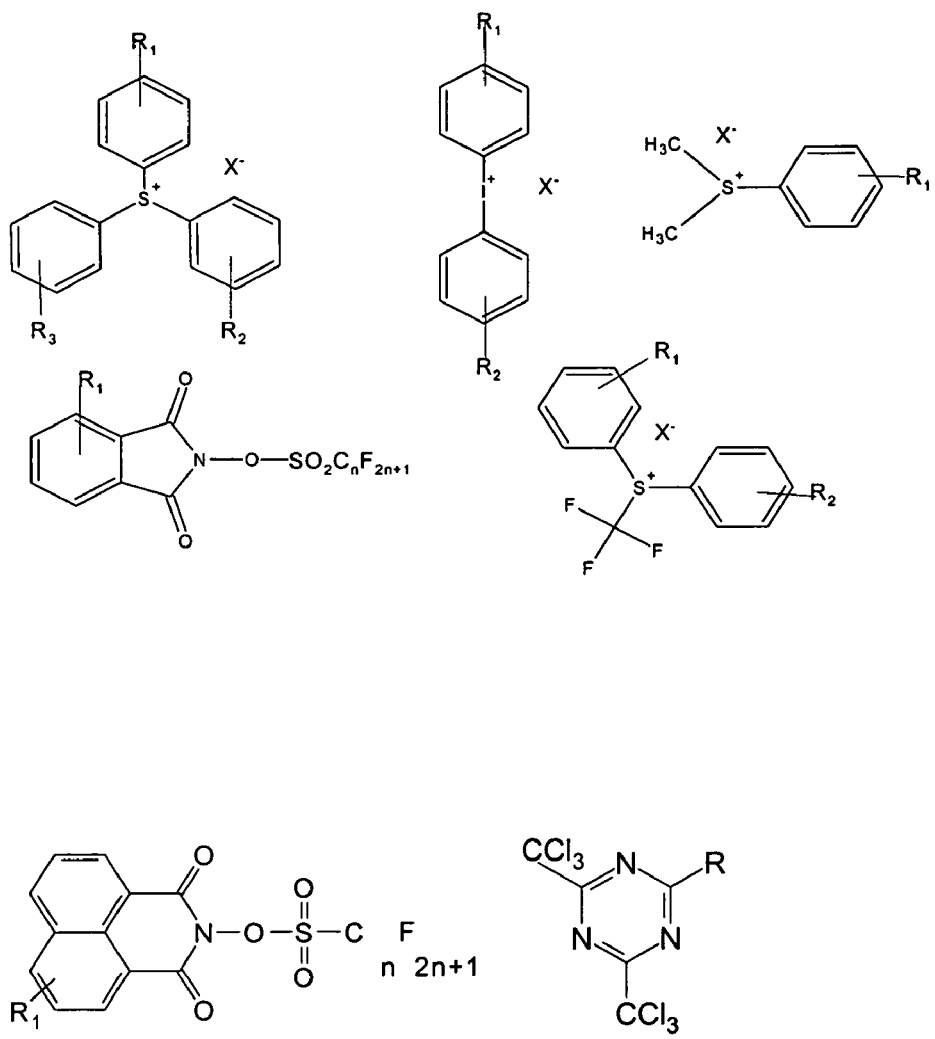
Figure 1 - Examples of Photoactive Compounds

NEGATIVE PHOTORESIST COMPOSITIONS

FIELD OF INVENTION

The present invention relates to a light-sensitive negative photoresist composition, comprising an alkali-soluble resin comprising at least one phenolic group derived from a hydroxystyrene monomer, a photoinitiator, and a photopolymerizable monomer comprising two or more (meth)acrylate groups. Preferably the photoresist film has a thickness greater than 5 microns. The invention further provides for a process for coating and imaging the light-sensitive composition of this invention.

BACKGROUND OF THE INVENTION

Photoresist compositions are used in microlithography processes for making miniaturized electronic components such as in the fabrication of computer chips and integrated circuits. Generally, in these processes, a coating of a film of a photoresist composition is first applied to a substrate material, such as silicon wafers used for making integrated circuits. The coated substrate is then baked to evaporate any solvent in the photoresist composition and to fix the coating onto the substrate. The baked coated surface of the substrate is next subjected to an image-wise exposure to radiation.

This radiation exposure causes a chemical transformation in the exposed areas of the coated surface. Visible light, ultraviolet (UV) light, electron beam and X-ray radiant energy are radiation types commonly used in microlithographic processes. When negative-working photoresist compositions are exposed image-wise to radiation, the areas of the photoresist composition exposed to the radiation become less soluble to a developer solution while the unexposed areas of the photoresist coating remain relatively soluble in such a solution. Thus, treatment of an exposed negative-working photoresist with a developer causes removal of the non-exposed areas of the photoresist coating and the creation of a negative image in the coating, thereby uncovering a desired portion of the underlying substrate surface on which the photoresist composition was formed.

After development of the photoresist film, the now partially unprotected substrate may be treated with a substrate-etchant solution, plasma gases, or have metal or metal composites deposited in the spaces of the substrate where the photoresist coating was removed during development. The areas of the substrate where the photoresist coating still remains are protected. Later, the remaining areas of the photoresist coating may be removed during a stripping operation, leaving a patterned substrate surface.

In the manufacture of patterned structures, such as wafer level packaging, electrochemical deposition of electrical interconnects has been used as the density of the interconnects increases. Gold bumps, copper posts and copper wires for redistribution in wafer level packaging require a resist mold that is later electroplated to form the final metal structures in advanced interconnect technologies. The photoresist layers are very thick compared to the photoresists used in the Integrated Circuit manufacturing of critical layers. Both feature size and photoresist thickness is typically in the range of 5 µm to 100 µm, so that high aspect ratios (resist thickness to line size) have to be patterned in the photoresist.

Devices manufactured for use as microelectromechanical machines also require very thick photoresist films in order to define the components of the machine.

It is the object of the present invention to provide a negative photoresist useful for imaging thick photoresist films, preferably as thick as 200 microns, which provide good lithographic properties, particularly photosensitivity, high aspect ratio, vertical sidewalls, improved adhesion on metal and silicon substrates, compatibility with electroplating solutions and process, reduced photoresist film cracking, ease and clean removal of the photoresist film after processing, and improved environmental stability. The applicants of the present invention have found that a photoresist comprising an alkali-soluble resin, where the polymer comprises at least one phenolic group derived from a hydroxystyrene monomer, at least one photoinitiator, and, at least one photopolymerizable monomer comprising 2 or more (meth)acrylate groups provides the desired lithographic properties when imaged, especially for thick films up to 200 microns.

BRIEF DESCRIPTION OF DRAWINGS

FIG. 1 illustrates examples of photoactive compounds.

SUMMARY

The present invention relates to a negative photoresist composition comprising, a) at least one alkali-soluble polymer, where the polymer comprises at least one unit of structure 1,

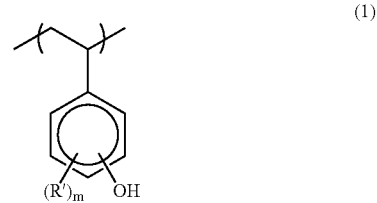

where, R' is selected independently from hydrogen, $(C_1\text{-}C_4)$ alkyl, chlorine and bromine, and m is an integer from 1 to 4; b) at least one monomer of structure 2,

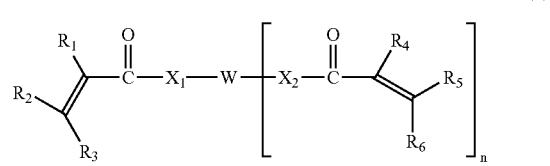

where, W is a multivalent linking group, $R_1$ to $R_6$ are independently selected from hydrogen, hydroxy, $(C_1\text{-}C_{20})$ alkyl and chlorine, $X_1$ and $X_2$ are independently oxygen or $N\text{—}R_7$, where $R_7$ is hydrogen or $(C_1\text{-}C_{20})$ alkyl, and n is an integer equal to or greater than 1, and c) at least one photoinitiator. The invention also relates to a process for imaging the negative photoresist composition.

DESCRIPTION OF THE INVENTION

The novel photoresist of the present invention provides for a light-sensitive negative photoresist composition useful for imaging thick films, comprising an alkali soluble polymer, a photoinitiator, and at least one photopolymerizable monomer comprising 2 or more (meth)acrylate groups, where the polymer comprises at least one phenolic group derived from a hydroxystyrene monomer. The invention further provides for a process for imaging the photoresist of the present invention, especially where the thickness of the photoresist is greater than about 5 microns and, particularly, where the process comprises a single exposure step. Photoresist films as thick as about 150 microns, or about 200 microns may be imaged. The negative photoresist composition is soluble in the aqueous alkaline developer prior to exposure but becomes insoluble in the exposed areas. The invention further relates to a process for imaging the negative photoresist composition.

The alkali soluble polymer of the present invention comprises at least one unit of structure 1, referred to in the present application as the unit comprising a phenolic group derived from the hydroxystyrene monomer,

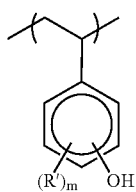

(1)

where, R' is selected independently from hydrogen, $(C_1-C_4)$ alkyl, chlorine, bromine and m is an integer from 1 to 4. The alkali soluble polymer of the negative photoresist of the present invention may be synthesized from at least one substituted or unsubstituted hydroxystyrene monomer. The hydroxystyrene monomer may be 3-hydroxystyrene or 4-hydroxystyrene. The hydroxystyrene monomer may be also selected from 3-methyl-4-hydroxystyrene, 3,5-dimethyl-4-hydroxystyrene, or 3,5-dibromo-4-hydroxystyrene. The polymer may be a homopolymer comprising the unit of structure 1, or a copolymer comprising the unit of structure 1 and a unit derived from at least one other monomer unit containing an unsaturated bond. Polymers that comprise two or more types of monomeric units may be employed in the present invention, for example forming a terpolymer or a tetrapolymer. The comonomeric unit may be of structure 2,

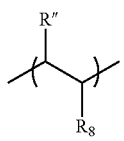

(2)

where, R" is independently selected from hydrogen, $(C_1-C_4)$ alkyl, and $R_8$ is a substituted or unsubstituted aromatic group, hydrogen, substituted or unsubstituted alicyclic group, linear or branched aliphatic group containing 1 to 20 carbon atoms. $R_8$ can further comprise hetero atoms, such as those chosen from oxygen, nitrogen and halogen (such as fluorine, chlorine and bromine) atoms to form groups such as alcohol, ether, ester, amine, amide, pendant halide groups or urethane. $R_8$ may be exemplified by groups such as substituted and unsubstituted phenyl; esters; aralkyl; alkyl ethers; linear and branched alkyls, such as methyl, ethyl, propyl, isopropyl, butyl, t-butyl, pentyl, hexyl and the like; cycloalkyls, such as cyclohexyl, cycloheptyl, and the like; bicycloalkyls, such as bicyclohexyl; adamantyls or cyano, amide, acetate, propionate, pyrrolidone, carbazole, and halide (fluoride, chloride and bromide), The comonomeric unit in the polymer may be further described by structure 3,

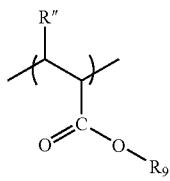

(3)

where R" is independently selected from hydrogen and $(C_1-C_4)$alkyl. $R_9$ is a substituted or unsubstituted aromatic group, substituted or unsubstituted alicyclic group, linear or branched aliphatic group containing 1 to 20 carbon atoms and hydrogen. $R_9$ can further comprise hetero atoms such as those chosen from oxygen, nitrogen and halogen atoms to form groups such as alcohol, ether, ester, amine, amide or urethane. $R_9$ may be exemplified by groups such as substituted and unsubstituted phenyl; esters; aralkyl; alkyl ethers; linear and branched alkyls, such as methyl, ethyl, propyl, isopropyl, butyl, t-butyl, pentyl, hexyl and the like; cycloalkyls, such as cyclohexyl, cycloheptyl, and the like; bicycloalkyls, such as bicyclohexyl; adamantyls.

In the above definitions and throughout the present specification, unless otherwise stated the terms used are described below.

Alkyl means linear or branched alkyl having the desirable number of carbon atoms and valence. The alkyl group is generally aliphatic and may be cyclic or acyclic (i.e. noncyclic). Suitable acyclic groups can be methyl, ethyl, n- or isopropyl, n-,iso, or tert-butyl, linear or branched pentyl, hexyl, heptyl, octyl, decyl, dodecyl, tetradecyl and hexadecyl. Unless otherwise stated, alkyl refers to 1-10 carbon atom moeity. The cyclic alkyl groups may be mono cyclic or polycyclic. Suitable example of mono-cyclic alkyl groups include substituted cyclopentyl, cyclohexyl, and cycloheptyl groups. The substituents may be any of the acyclic alkyl groups described herein.

Suitable bicyclic alkyl groups include substituted bicycle [2.2.1]heptane, bicyclo[2.2.2]octane, bicyclo[3.2.1]octane, bicyclo[3.2.2]nonane, and bicyclo[3.3.2]decane, and the like. Examples of tricyclic alkyl groups include tricyclo[5.4.0.0.$^{2,9}$]undecane, tricyclo[4.2.1.2.$^{7,9}$]undecane, tricyclo[5.3.2.0.$^{4,9}$]dodecane, and tricyclo[5.2.1.0.$^{2,6}$]decane. As mentioned herein the cyclic alkyl groups may have any of the acyclic alkyl groups as substituents.

Alkylene groups are divalent alkyl groups derived from any of the alkyl groups mentioned hereinabove. When referring to alkylene groups, these include an alkylene chain substituted with $(C_1-C_6)$alkyl groups in the main carbon chain of the alkylene group. Alkylene groups can also include one or more alkyne groups in the alkylene moiety, where alkyne refers to a triple bond. Essentially an alkylene is a divalent hydrocarbon group as the backbone. Accordingly, a divalent acyclic group may be methylene, 1,1- or 1,2-ethylene, 1,1-, 1,2-, or 1,3 propylene, 2,5-dimethyl-2,5-hexene, 2,5-dimethyl-2,5-hex-3-yne, and so on. Similarly, a divalent cyclic alkyl group may be 1,2- or 1,3-cyclopentylene, 1,2-, 1,3-, or 1,4-cyclohexylene, and the like. A divalent tricyclo alkyl groups may be any of the tricyclic alkyl groups mentioned herein in above. A particularly useful tricyclic alkyl group in this invention is 4,8-bis(methylene)-tricyclo[5.2.1.0.$^{2,6}$]decane.

Aryl groups contain 6 to 24 carbon atoms including phenyl, tolyl, xylyl, naphthyl, anthracyl, biphenyls, bis-phenyls, trisphenyls and the like. These aryl groups may further be substituted with any of the appropriate substituents e.g. alkyl, alkoxy, acyl or aryl groups mentioned hereinabove. Similarly, appropriate polyvalent aryl groups as desired may be used in this invention. Representative examples of divalent aryl groups include phenylenes, xylylenes, naphthylenes, biphenylenes, and the like.

Alkoxy means straight or branched chain alkoxy having 1 to 10 carbon atoms, and includes, for example, methoxy, ethoxy, n-propoxy, isopropoxy, n-butoxy, isobutoxy, tert-butoxy, pentyloxy, hexyloxy, heptyloxy, octyloxy, nonanyloxy, decanyloxy, 4-methylhexyloxy, 2-propylheptyloxy, and 2-ethyloctyloxy.

Aralkyl means aryl groups with attached substituents. The substituents may be any such as alkyl, alkoxy, acyl, etc. Examples of monovalent aralkyl having 7 to 24 carbon atoms include phenylmethyl, phenylethyl, diphenylmethyl, 1,1- or 1,2-diphenylethyl, 1,1-, 1,2-, 2,2-, or 1,3-diphenylpropyl, and the like. Appropriate combinations of substituted aralkyl groups as described herein having desirable valence may be used as a polyvalent aralkyl group.

The term (meth)acrylate refers to methacrylate or acrylate, and similarly, (meth)acrylic refers to methacrylic or acrylic.

Furthermore, and as used herein, the term "substituted" is contemplated to include all permissible substituents of organic compounds. In a broad aspect, the permissible substituents include acyclic and cyclic, branched and unbranched, carbocyclic and heterocyclic, aromatic and non-aromatic substituents of organic compounds. Illustrative substituents include, for example, those described hereinabove. The permissible substituents can be one or more and the same or different for appropriate organic compounds. For purposes of this invention, the heteroatoms such as nitrogen may have hydrogen substituents and/or any permissible substituents of organic compounds described herein which satisfy the valencies of the heteroatoms. This invention is not intended to be limited in any manner by the permissible substituents of organic compounds.

The alkali soluble polymer may comprise an acid cleavable (labile) bond, which in the presence of an acid makes the polymer even more readily soluble in an aqueous alkali developer or a stripper. The acid may be generated thermally and/or photochemically. The acid cleavable bond, preferably comprises an acid cleavable C(O)OC, C—O—C or C—O—Si bond. Examples of acid cleavable groups usable herein include acetal or ketal groups formed from alkyl or cycloalkyl vinyl ethers, silyl ethers formed from suitable trimethylsilyl or t-butyl(dimethyl)silyl precursors, and carboxylates formed from t-butyl acetate, amyl acetate, 1-alkylcycloalkyl acetate, or 1-alkyladamantyl acetate precursors. Also useful are groups such as (tert-butoxycarbonyl)methyl and its $(C_1-C_6)$ alkyl analogs. The acid labile groups may be pendant from the polymer backbone or pendant from groups attached to the polymer backbone. The acid cleavable group may be formed by partially capping the hydroxystyrene monomeric unit with a compound containing the acid cleavable group and/or be incorporated in the comonomer.

The comonomer is one capable of being polymerized with the hydroxystyrene monomer forming the unit of structure (1) in the polymer, and may be exemplified by comonomers such as styrene, vinylnaphthalene, 3- or 4-acetoxystyrene, (meth) acrylic acid, (meth) acrylonitrile, methyl(meth)acrylate, t-butyl(meth)acrylate, 1-methyl-cyclopentyl(meth)acrylate, 1-methyl-cyclohexyl (meth)acrylate, 2-methyl-adamantyl-2-(meth)acrylate, 2-ethyl-adamantyl-2-(meth)acrylate, 2-butyl-adamantyl-2-(meth)acrylate, substituted or unsubstituted hydroxystyrene with an acid cleavable group, an ethylenic comonomer with an acid cleavable group, and norbornene derivative with an acid cleavable group.

The polymer may be prepared from the corresponding monomers by any suitable conventional polymerization process which react an ethylenically unsaturated group. Such processes include, but are not limited to free radical polymerization or ionic polymerization. Such processes are typically run in solvent or solvent mixture using a catalyst or initiator. Initiators can be chosen based on the temperature to be employed in the polymerization. Examples of suitable free radical initiators are benzoyl peroxide, 2,2'-azobisisobutyronitrile and lauroyl peroxide. Optionally, a chain transfer agent may be included, such as 1-dodecanethiol.

The monomeric unit of structure 1 may range from about 10 mole % to about 100 mole % in one embodiment, from about 30 mole % to about 80 mole % in another embodiment, and from about 40 mole % to about 70 mole % in another embodiment.

The alkali soluble polymer of the present invention has a weight average molecular weight ranging from about 2,000 to about 100,000, preferably from about 3,000 to about 50,000, and more preferably from about 5,000 to about 30,000. The polymer is present in the formulation at levels ranging from about 5 to about 75 weight %, preferably from about 10 to about 70 weight % by total solids of the photoresist.

The negative photoresist composition of the present invention also comprises a photopolymerizable monomer, which is capable of polymerizing in the presence of a photoinitiator and contains at least two ethylenic unsaturated bonds. The photopolymerizable monomer is a (meth)acrylate and can be illustrated by structure 4,

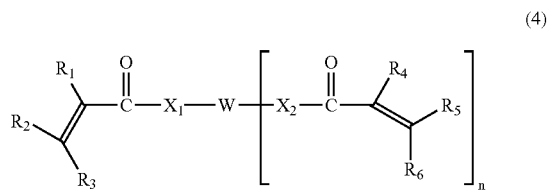

(4)

where, W is a multivalent linking group, $R_1$ to $R_6$ are independently selected from hydrogen, hydroxy, $(C_1-C_{20})$ alkyl and chlorine, $X_1$ and $X_2$ are independently oxygen or N—$R_7$, where $R_7$ is hydrogen or $(C_1-C_{20})$ alkyl, and n is an integer equal to or greater than 1. In one embodiment $R_7$ is hydrogen or $(C_1-C_4)$ alkyl. In one embodiment $X_1$ and $X_2$ are oxygen. W is a multivalent linking group, where W can be a small molecular moiety or a polymer. Examples of multivalent W are a divalent, trivalent, tetravalent, pentavalent, hexavalent and heptavalent moiety, and n can range from 1 to about 7. The monomer may also be a polymer with pendant vinyl groups, such as the acrylate groups in structure 4, where W is a polymer. W can further be a linear or branched alkylene group containing 1-20 carbon atoms; the alkylene group may additionally contain one or more pendant hydroxy groups, alkyne bonds, ester groups, ether groups, amide groups or other acceptable organic groups. W may be $(C_2-C_3)$ alkoxylated $(C_1-C_{20})$ alkylene. In one embodiment W is a hydrocarbon moiety containing only carbon and hydrogen atoms.

The above-mentioned polymerizable monomer is a polymerizable compound having at least two ethylenic unsaturated double bonds in a molecule, such as alkyl acrylates, hydroxyalkyl acrylates, alkyl methacrylates or hydroxyalkyl methacrylates. Examples of the polymerizable compound are not particularly limited and can be appropriately selected depending on the purposes, and include acrylic acid derivatives such as acrylic acid esters and methacrylic acid derivatives such as methacrylic acid esters. The polymerizable monomer may have a low molecular weight (monomer property) or a high molecular weight (oligomer or polymer property).

Examples of the polymerizable monomer containing two or more double bonds include unsaturated esters, as shown in Structure 4. The polymerizable monomer may be derived from the reaction of unsaturated carboxylic acids or unsaturated acid chlorides with compounds containing epoxy groups, more than 2 hydroxy groups (polyols), two or more amino groups (polyamines), mixture of hydroxyl and amino (amino alcohol) groups or mixtures of these groups. Examples of the unsaturated carboxylic acids include unsaturated fatty acids such as acrylic acid, methacrylic acid, crotonic acid, itaconic acid, cinnamic acid, linoleic acid and oleic acid. Among these, acrylic acid and methacrylic acid are preferable. The equivalent acid chlorides to the above mentioned unsaturated carboxylic acids may also be used. Suitable polyols are aromatic and particularly aliphatic and alicyclic polyols. Examples of the aliphatic and alicyclic polyols include alkylene diols preferably having 2 to 12 carbon atoms such as ethylene glycol, 1,2- or 1,3-propenediol, 1,2-, 1,3- or 1,4-butanediol, pentanediol, hexanediol, 2,5-hexanediol, octanediol, dodecanediol, diethylene glycol, and triethylene glycol; polyethylene glycol having 200 to 1,500 molecular weight, 1,3-cyclopentanediol, 1,2-, 1,3-, or 1,4-cyclohexanediol, 1,4-dihydroxymethylcyclohexane, glycerol, tris(β-hydroxyethyl)amine, trimethylolethane, trimethylolpropane, pentaerythritol, dipentaerythritol and sorbitol. Aromatic polyols can be bisphenol A or its analogs.

Examples of amines are alkylene amines, and include 1,2-ethylene diamine, 1,2- or 1,3-propylene diamine, diaminocyclohexane, 1,3-cyclohexanebismethylamine, 2,2-ethylenedioxybisethylamine and the like. Examples of amino alcohols include 3-amino-1-propanol and the like. Examples of epoxy compounds include 1,2,7,8-diepoxyethane and the like.

Examples of the multi-unsaturated compound of a relatively high molecular weight (oligomer/polymer property) include unsaturated polyester resins generally produced from maleic acid, phthalic acid, and one or more diols and having a molecular weight of about 500 to 3,000.

Polyols can be partially or completely esterified with one kind of carboxylic acid or different types of unsaturated carboxylic acids and in the partially esterified compounds, free hydroxyl may be modified and, for example, esterified with other carboxylic acids.

Examples of the polymerizable monomer are without limitation as follows: 4,4'-bis(2-acryloyloxyethoxy)diphenyl propane, vinyl acrylate, trimethylolpropane triacrylate, trimethylolethane triacrylate, trimethylolpropane trimethacrylate, trimethylolethane trimethacrylate, tetramethylene glycol dimethacrylate, triethylene glycol dimethacrylate, tetraethylene glycol diacrylate, pentaerythritol diacrylate, pentaerythritol triacrylate, pentaerythritol tetraacrylate, dipentaerythritol diacrylate, dipentaerythritol triacrylate, dipentaerythritol tetraacrylate, dipentaerythritol pentaacrylate, dipentaerythritol hexaacrylate, tripentaerythritol octaacrylate, pentaerythritol dimethacrylate, pentaerythritol trimethacrylate, dipentaerythritol dimethacrylate, dipentaerythritol tetramethacrylate, tripentaerythritol octamethacrylate, pentaerythritol diitaconate, dipentaerythritol trisitaconate, dipentaerythritol pentaitaconate, dipentaerythritol hexaitaconate, ethylene glycol diacrylate, 1,3-butanediol diacrylate, 1,3-butanediol dimethacrylate, 1,4-butanediol diitaconate, sorbitol triacrylate, sorbitol tetraacrylate, pentaerythritol-modified triacrylate, sorbitol tetramethacrylate, sorbitol pentaacrylate, sorbitol hexaacrylate, oligoester acrylate, and methacrylate, glycerol diacrylate, and triacrylate, 1,4-cyclohexane diacrylate, bisacrylate and bismethacrylate of polyethylene glycol with a molecular weight of 200 to 1,500 and their mixtures.

Further examples for polymerizable monomers include 1,2-ethanediol diacrylate, 1,2-propanediol diacrylate, 1,4-butanediol diacrylate, hexan-1,6-diol diacrylate, dipropylene glycol diacrylate, neopentyl glycol diacrylate, ethoxylated neopentyl glycol diacrylate, propoxylated neopentyl glycol diacrylate, tripropylene glycol diacrylate, bisphenol A diglycidylether diacrylate, ethoxylated bisphenol A diglycidylether diacrylate, polyethylene glycol diacrylate, trimethylolpropane triacrylate, ethoxylated trimethylolpropane triacrylate, propoxylated trimethylolpropane triacrylate, propoxylated glycerine triacrylate, tris(2-acryloyloxy ethyl)isocyanurate, pentaerythritol triacrylate, ethoxylated pentaerythritol triacrylate, pentaerythritol tetraacrylate, ethoxylated pentaerythritol tetraacrylate, di(trimethylolpropane)tetraacrylate, di(pentaerythritol) pentaacrylate, di(pentaerythritol)hexaacrylate and oligomers and polymers containing acrylate groups obtained by conversion of poly epoxides with acrylic acid (epoxy acrylate) or by conversion of polyester polyol with acrylic acid or monomeric alkyl acrylates (polyester acrylates) or by conversion of isocyanate prepolymers with 2-hydroxyethyl acrylate ((polyurea acrylate) and acrylated soy bean oil and acrylated silicone oil.

The photopolymerizable monomer may also comprise acid cleavable groups which in the presence of an acid will cleave to form compounds which increase the aqueous alkaline solubility of the coating of the present invention. Such acid cleavable groups may be C(O)—OC, C—O—C or C—O—Si groups within the monomer. Generally known acid cleavable groups may be used. In one embodiment the acid cleavable group comprises a tertiary carbon atom adjacent to an oxygen atom or nitrogen atom ($X_1$ and/or $X_2$) of the monomer of structure 4, and the tertiary carbon atom has ($C_1$-$C_5$) alkyl groups attached to this carbon atom, that is the monomer comprises a tertiary alkyl ester. Thus, W is a ($C_1$-$C_{20}$) alkylene chain with tertiary carbon atoms at the end of the chain linking to the acrylate end groups, where 2,5-dimethyl-2-5-hexene is an example of the linking group, W. Thus W can be $C(R_{10}R_{11})$—($C_1$-$C_{20}$)alkylene-$C(R_{12}R_{13})$, where $R_{10}$, $R_{11}$, $R_{12}$ and $R_{13}$ are independently selected from ($C_1$-$C_5$) alkyl groups. W may additionally contain acid cleavable groups such C(O)—OC, C—O—C or C—O—Si groups within the moiety. The acid may be generated thermally and/or photochemically using thermal acid generators and/or photoacid generators.

In the photopolymerizable composition of the present invention, the composition contains at least one photoinitiator or photoradical generating agent capable of generating a radical upon exposure to a light source. Any photoiniator capable of generating a radical upon exposure to radiation may be used. One or more photoinitiators may be selected from those capable of starting polymerization of the polymerizable compound contained in the composition of the present invention and to be used as the above-mentioned photoinitiator. Examples of the above-mentioned photoinitiator include without limitation benzophenone, camphorquinone, 4,4-bis(dimethylamino)benzophenone, 4-methoxy-4'-dimethylaminobenzophenone, 4,4'-dimethoxybenzophenone, 4-dimethylaminobenzophenone, 4-dimethylaminoacetophenone, benzylanthraquinone, 2-tert-butylanthraquinone, 2-methylanthraquinone, xanthone, thioxanthone, 2-chlorothioxanthone, 2,4-diethylthioxanthone, fluorene, acridone, bisacylphosphine oxides such as bis(2,4,6-trimethylbenzoyl)-phenylphosphine oxide and the like, α-hydroxy or α-aminoacetophenones, α-hydroxycycloalkylphenylketones, and aromatic ketones such as dialkoxyacetophenone; benzoin and benzoin ethers such as benzoinmethyl ether, benzomethyl ether, benzoinpropyl ether, benzoinphenyl ether, and the like; 2,4,6-triarylimidazole dimers such as 2-(o-chlorophenyl)-4,5-diphenylimidazole dimer, 2-(o-chlorophenyl)-4,5-di(m-methoxyphenyl)imidazole dimer, 2-(o-fluorophenyl)-4,5-diphenylimidazole dimer, 2-(o-methoxyphenyl)-4,5-diphenylimidazole dimer, 2-(p-methoxyphenyl)-4,5-diphenylimidazole dimer; and lophine dimer compounds described in U.S. Pat. Nos. 3,784,557, 4,252,887, 4,311,783, 4,459,349, 4,410,621, 4,622,286 and the like: polyhalogen compounds such as tetrabromocarbon, phenyltribromomethylsulfone, phenyltrichloromethyl ketone and the like; and compounds described in U.S. Pat. No. 3,615,455; S-triazine derivatives (trihalomethyl compounds) having trihalogen-substituted methyl, such as 2,4,6-tris(trichloromethyl)-S-triazine, 2-methoxy-4,6-bis(trichloromethyl)-S-triazine, 2-amino-4,6-bis(trichloromethyl)-S-triazine, 2-(P-methoxystyryl-4,6-bis(trichloromethyl)-S-triazine and the like; organic peroxides, such as methyl ethyl ketone peroxide, cyclohexanone peroxide, 3,3,5-trimethylcyclohexanone peroxide, benzoyl peroxide, di-tert-butyl peroxyisophthalate, 2,5-dimethyl-2,5-di(benzoylperoxy)hexane, tert-butyl peroxybenzoate, a,a'-bis(tert-butylperoxyisopropyl)benzene, dicumyl peroxide, 3,3',4,4'-tetra-(tert-butylperoxycarbonyl)benzophenone and the like; azinium compounds; organic boron compounds; phenylglyoxalic acid esters such as phenylglyoxalic methyl ester; titanocenes such as bis($\eta^5$-2,4-cyclopentadien-1-yl)-bis(2,6-difluoro-3-(1H-pyrrol-1-yl)-phenyl)titanium and the like; onium salt compounds such as diaryliodonium salts and triarylsulfonium salts obtained by using diphenyliodonium, 4,4'-dichlorodiphenyliodonium, 4,4'-dimethoxydiphenyliodonium, 4,4'-di-t-butylidiphenyliodonium, 4-methyl-4'-isopropyl-diphenyliodonium, or 3,3'-dinitrodiphenyliodonium in combination with chloride, bromide, tetrafluoroborate, hexafluorophosphate, hexafluoroarsenate, hexafluoroantimonate, tetrakis(pentafluorophenyl)borate, or trifluoromethanesulfonic acid;

Preferred photoinitiators are those available under the trade designations IRGACURE and DAROCUR from Ciba Speciality Chemical Corp., Tarrytown, N.Y. and include 1-hydroxy cyclohexyl phenyl ketone (IRGACURE 184), 2,2-dimethoxy-1,2-diphenylethan-1-one (IRGACURE 651), bis (2,4,6-trimethylbenzoyl)phenylphosphineoxide (IRGACURE 819), 1-[4-(2-hydroxyethoxy)phenyl]-2-hydroxy-2-methyl-1-propane-1-one (IRGACURE 2959), 2-benzyl-2-dimethylamino-1-(4-morpholinophenyl)butanone (IRGACURE 369), 2-methyl-1-[4-(methylthio)phenyl]-2-morpholinopropan-1-on-e (IRGACURE 907), and 2-hydroxy-2-methyl-1-phenyl propan-1-one (DAROCUR 1173). Particularly preferred photoinitiators are IRGACURE 819, 369 and 907.

Moreover, as the above-mentioned photoinitiator, two or more kinds of those exemplified compounds may be used in combination. Examples thereof include the following: any combinations of acrylphosphine oxides, alpha-hydroxy ketones and alpha-amino ketones.

The combination of 2-methyl-1[4-(methylthio)phenyl]-2-morpholinopropan-1-one (Irgacure 907) and bis(2,4,6-trimethylbenzoyl)-phenylphosphineoxide (Irgacure 819) is used in one embodiment.

The photopolymerizable composition of the present invention may further contain sensitizers, such as isopropyl thioxanthone and 3-keto cumarine, which absorb radiation at one particular wavelength and transfer energy to the photosensitive compound at a different wavelength.

In addition the photopolymerizable composition of the present invention may contain so called accelerators, such as tributylamine, N-methyl diethanolamine, N-butyl diethanolamine, triethanolamine, piperidine, morpholine, piperazine, and acrylated amines, obtained from 1,6-hexanediol diacrylate and ethanolamine tributylamine, N-methyl diethanolamine, N-butyl diethanolamine, triethanolamine, piperidine, morpholine, piperazine, and acrylated amines, obtained from 1,6-hexanediol diacrylate and ethanolamine.

In order to prevent inhibition of polymerization by oxygen, a waxy compound, such as polyolefins, can be added to the composition. It is believed that as a consequence of their appropriate solubility in the mixtures, they float on top of the mixture at the start of polymerization and form a thin protecting layer between atmospheric oxygen and the polymerizing mixture. Additionally, auto-oxidizing compounds like allyl ethers can be added that prevent inhibition of polymerization by oxygen in some cases.

The negative composition of the present invention comprises an alkali soluble polymer, an unsaturated photopolymerizable monomer and a photoinitiator. The concentration of the polymer can range from about 10 weight % by total solids of the photoresist to about 50 weight % by solids, the concentration of the monomer can range from about 10 weight % by solids to about 50 weight % by solids, and the concentration of the photoiniator can range from about 0.5 weight % by solids to about 20 weight % by solids.

The negative photoresist composition of the present invention comprises a polymer, a polymerizable monomer and a photoinitiator. The composition can further include a thermal acid generator (TAG) and/or photoacid generator (PAG) which produces an acid when exposed with radiation. It is believed that the acid reacts with the acid cleavable group to make the photoresist more soluble in an alkaline solution or stripper that removes the photoresist. It is desirable in one embodiment to have the photoresist which remains on the substrate removed after the processing of the substrate such that the photoresist is not part of the device. The acid generated can either reduce the molecular weight of the constituents of the photoresist and/or form groups that increase the solubility of the photoresist. It is desirable to remove the photoresist in the best and cleanest process possible. A thermal acid generator produces an acid upon heating. A photoacid generator produces an acid when exposed to radiation and also by heating; the radiation typically is at a different wavelength(s) as that used to expose the photoresist. A flood exposure or an imagewise exposure may be used to generate the acid, and the substrate may be further heated to break the acid cleavable bond.

Any known thermal acid generators and photoacid generators may be used alone or as mixtures. Any photoacid generators (PAG) may be used which generates a strong acid capable of cleaving the acid cleavable bond present in the composition of the present invention, particularly a sulfonic acid. Suitable examples of acid generating photosensitive compounds include, without limitation, ionic photoacid generators (PAG), such as diazonium salts, iodonium salts, sulfonium salts, or non-ionic PAGs such as diazosulfonyl compounds, sulfonyloxy imides, nitrobenzyl sulfonate esters, and imidosulfonates, although any photosensitive compound that produces an acid upon irradiation may be used. The onium salts are usually used in a form soluble in organic solvents, mostly as iodonium or sulfonium salts, examples of which are diphenyliodonium trifluoromethane sulfonate, diphenyliodonium nonafluorobutane sulfonate, triphenylsulfonium trifluoromethane sulfonate, triphenylsulfonium nonafluorobutane sulfonate and the like. Other useful onium salts such as those disclosed in U.S. patent applications with numbers US 2003/0235782, US 2004/0265733, US 2004/0229155, US 2005/0271974, and are incorporated herein by reference. Other compounds that form an acid upon irradiation that may be used are triazines, oxazoles, oxadiazoles, thiazoles, substituted 2-pyrones. PAGs such as those described in US2002/0061464 are also useful. Phenolic sulfonic esters, trichloromethyltriazines, bis-sulfonylmethanes, bis-sulfonylmethanes or bis-sulfonyldiazomethanes, triphenylsulfonium tris(trifluoromethylsulfonyl)methide, triphenylsulfonium bis(trifluoromethylsulfonyl)imide, diphenyliodonium tris(trifluoromethylsulfonyl)methide, diphenyliodonium bis(trifluoromethylsulfonyl)imide, N-hydroxynaphthalimide triflate, and their homologues are also possible candidates. FIG. 1 shows some examples of photoactive compounds, where $R_1$ and $R_2$ are $(C_1$-$C_8)$alkyl or $(C_1$-$C_8)$alkoxy substituents and n=1-20, and R is independently selected from $(C_1$-$C_8)$alkyl, $(C_1$-$C_8)$alkoxy, phenyl, styrylphenyl, $(C_1$-$C_8)$ alkoxy-styrylphenyl, furylethylidene, $(C_1$-$C_8)$alkyl substituted furylethylidene, naphthyl, $(C_1$-$C_8)$alkyl or $(C_1$-$C_8)$alkoxy substituted naphthyl. Mixtures of photoactive compounds may also be used. In one preferred embodiment iodonium salts and sulfonium salts as photoactive compounds are preferred, and sulfonium salts as photoactive compounds are more preferred.

The thermal acid generator (TAG) used in the present invention may be any that upon heating generates an acid which can cleave the acid cleavable bond present in the invention, particularly a strong acid such as a sulfonic acid. Preferably, the thermal acid generator is activated at 90° C. and more preferably at above 120° C., and even more preferably at above 150° C. The photoresist film is heated for a sufficient length of time to react with the coating. Examples of thermal acid generators are nitrobenzyl tosylates, such as 2-nitrobenzyl tosylate, 2,4-dinitrobenzyl tosylate, 2,6-dinitrobenzyl tosylate, 4-nitrobenzyl tosylate; benzenesulfonates such as 2-trifluoromethyl-6-nitrobenzyl 4-chlorobenzenesulfonate, 2-trifluoromethyl-6-nitrobenzyl 4-nitro benzenesulfonate; phenolic sulfonate esters such as phenyl, 4-methoxybenzenesulfonate; alkyl ammonium salts of organic acids, such as triethylammonium salt of 10-camphorsulfonic acid. A variety of aromatic (anthracene, naphthalene or benzene derivatives) sulfonic acid amine salts can be employed as the TAG, including those disclosed in U.S. Pat. Nos. 3,474,054, 4,200,729, 4,251,665 and 5,187,019. Preferably the TAG will have a very low volatility at temperatures between 170-220° C. Examples of TAGs are those sold by King Industries under Nacure and CDX names. Such TAG's are Nacure 5225, and CDX-2168E, which is a dodecylbenzene sulfonic acid amine salt supplied at 25-30% activity in propylene gycol methyl ether from King Industries, Norwalk, Conn. 06852, USA.

The photoacid generator and/or the thermal acid generator, may be incorporated in a range from about 0.1 to about 10 weight % by total solids of the photoresist, preferably from 0.3 to 5 weight % by solids, and more preferably 0.5 to 2.5 weight % by solids.

The photoresist of the present invention may contain other components such as additives, surfactants, dyes, plasticizers, and other secondary polymers. Surfactants are typically compounds/polymers containing fluorine or silicon compounds which can assist in forming good uniform photoresist coatings. Certain types of dyes may be used to provide absorption of unwanted light. Plasticizers may be used, especially for thick films, to assist in flow properties of the film, such as those containing sulfur or oxygen. Examples of plasticizers are adipates, sebacates and phthalates. Surfactants and/or plasticizers may be added at concentrations ranging from about 0.1 to about 10 weight % by total weight of solids in the photoresist composition. Secondary polymers may be added to the composition of the present invention. These secondary polymers provide properties that enhance the physical and lithographic properties of the photoresist composition, such as providing scum-free development. Polymers containing hydrophilic groups are preferred. Examples of secondary polymers are unsubstituted or substituted (meth)acrylic acid containing polymers or copolymers, unsubstituted or substituted (meth)acrylate containing polymers or copolymers, unsubstituted or substituted vinyl ester containing polymers or copolymers, unsubstituted or substituted vinyl aromatic containing polymers or copolymers, (meth)acrylic acid-styrene copolymers and novolak polymers. Novolak polymers can be prepared from polymerization of phenol, cresols, di- and trimethyl-substituted-phenols, polyhydroxybenzenes, naphthols, polyhydroxynaphthols and other alkyl-substituted-polyhydroxyphenols and formaldehyde, acetaldehyde or benzaldehyde. Secondary polymers may be added at levels ranging from about 0% to about 70%, preferably from about 10% to about 40% of total solids of the photoresist.

In producing the photoresist composition, the solid components of the photoresist are mixed with a solvent or mixtures of solvents that dissolve the solid components of the photoresist. Suitable solvents for photoresists may include, for example, a glycol ether derivative such as ethyl cellosolve, methyl cellosolve, propylene glycol monomethyl ether, diethylene glycol monomethyl ether, diethylene glycol monoethyl ether, dipropylene glycol dimethyl ether, propylene glycol n-propyl ether, or diethylene glycol dimethyl ether; a glycol ether ester derivative such as ethyl cellosolve acetate, methyl cellosolve acetate, or propylene glycol monomethyl ether acetate; carboxylates such as ethyl acetate, n-butyl acetate and amyl acetate; carboxylates of di-basic acids such as diethyloxylate and diethylmalonate; dicarboxylates of glycols such as ethylene glycol diacetate and propylene glycol diacetate; and hydroxy carboxylates such as methyl lactate, ethyl lactate, ethyl glycolate, and ethyl-3-hydroxy propionate; a ketone ester such as methyl pyruvate or ethyl pyruvate; an alkoxycarboxylic acid ester such as methyl 3-methoxypropionate, ethyl 3-ethoxypropionate, ethyl 2-hydroxy-2-methylpropionate, or methylethoxypropionate; a ketone derivative such as methyl ethyl ketone, acetyl acetone, cyclopentanone, cyclohexanone or 2-heptanone; a ketone ether derivative such as diacetone alcohol methyl ether; a ketone alcohol derivative such as acetol or diacetone alcohol; lactones such as butyrolactone; an amide derivative such as dimethylacetamide or dimethylformamide, anisole, and mixtures thereof.

The photoresist solution is prepared as is known in the art.

The prepared photoresist composition solution can be applied to a substrate by any conventional method used in the photoresist art, including dipping, spraying, whirling and spin coating. When spin coating, for example, the photoresist solution can be adjusted with respect to the percentage of solids content, in order to provide coating of the desired thickness, given the type of spinning equipment utilized and the amount of time allowed for the spinning process. Suitable substrates include, without limitation, silicon, copper, aluminum, polymeric resins, silicon dioxide, silicon coated with metal layers, metals, doped silicon dioxide, silicon nitride, tantalum, polysilicon, ceramics, aluminum/copper mixtures; gallium arsenide and other such Group III/V compounds.

The photoresist coatings produced by the photoresist of the present invention are particularly suitable for application to copper coated silicon wafers, such as are utilized in the production of microprocessors and other miniaturized integrated circuit components. A silicon/silicon dioxide wafer can also be used. The substrate may also comprise various polymeric resins, especially antireflective coatings. The substrate may have an adhesion promoted layer of a suitable composition, such as one containing hexa-alkyl disilazane.

The photoresist composition solution is then coated onto the substrate, and the substrate is treated at a temperature from about 70° C. to about 150° C. for from about 30 seconds to about 6 minutes on a hot plate or for from about 15 to about 90 minutes in a convection oven. This temperature treatment is selected in order to reduce the concentration of residual solvents in the photoresist, while not causing substantial thermal degradation of the compounds in the film. In general, one desires to minimize the concentration of solvents and this first temperature treatment is conducted until substantially all of the solvents have evaporated and a coating of photoresist composition, on the order of 5-200 microns (micrometer) in thickness, remains on the substrate. Multiple coatings may be done to achieve thick films. In a preferred embodiment the temperature is from about 95° C. to about 135° C. The temperature and time selection depends on the photoresist properties desired by the user, as well as the equipment used and commercially desired coating times. The coating substrate can then be exposed to actinic radiation, e.g., ultraviolet radiation, at a wavelength of from about 200 nm (nanometers) to about 450 nm, x-ray, electron beam, ion beam or laser radiation, in any desired pattern, produced by use of suitable masks, negatives, stencils, templates, etc. Generally, thick photoresist films are exposed using broadband radiation, using equipments such as Ultratech, Karl Süss or Perkin Elmer broadband exposure tools, although 436 nm and 365 nm Steppers may also be used.

The photoresist is then optionally subjected to a post exposure second baking or heat treatment either before or after development. The heating temperatures may range from about 90° C. to about 150° C., more preferably from about 90° C. to about 130° C. The heating may be conducted for from about 30 seconds to about 3 minutes, more preferably from about 60 seconds to about 2 minutes on a hot plate or about 30 to about 45 minutes by convection oven.

The exposed photoresist-coated substrates are developed by immersion in a developing solution or developed by spray development process to form a pattern in the photoresist film. The solution is preferably agitated, for example, by nitrogen burst agitation. The substrates are allowed to remain in the developer until all, or substantially all, of the photoresist coating has dissolved from the exposed areas. Developers include aqueous solutions of ammonium or alkali metal hydroxides. Preferred hydroxides are tetramethyl ammonium hydroxide, sodium hydroxide or potassium hydroxide. Additives, such as surfactants and buffers, may be added to the developer. After removal of the coated wafers from the developing solution, one may conduct an optional post-development heat treatment or bake to increase the coating's adhesion and density of the photoresist. The imaged substrate may then be coated with metals, or layers of metals to form bumps as is well known in the art, or processed further as desired.

In one embodiment the photoresist must be removed from the substrate, typically after the metal layers have been formed or after any other type of processing. The substrate with the imaged photoresist may be heated or, exposed and heated, to make the photoresist soluble before removing the photoresist in an alkaline developer or stripper. Alkaline developers described previously may be used. Any known strippers may be used, such as AZ® 300T and AZ® 400T, available from AZ® Electronic Materials USA Corps, Somerville, N.J.

Unless otherwise indicated, all numbers expressing quantities of ingredients, properties such as molecular weight, reaction conditions, and so forth used in the specification and claims are to be understood as being modified in all instances by the term "about." Each of the documents referred to above are incorporated herein by reference in its entirety, for all purposes. The following specific examples will provide detailed illustrations of the methods of producing and utilizing compositions of the present invention. These examples are not intended, however, to limit or restrict the scope of the invention in any way and should not be construed as providing conditions, parameters or values which must be utilized exclusively in order to practice the present invention.

EXAMPLES

Synthesis Example 1 Preparation of methacrylate monomer, 2,5-dimethyl-2,5-hexanediol dimethacrylate (DMHMA)

A 5 liter four-neck round bottom flask was fitted with a stopped dropping funnel, thermometer and mechanical stirrer. After it was purged with nitrogen, the 5 liter flask was charged with 875 ml tetrahydrofuran (THF), 875 ml acetonitrile, 350 g (3.4 mol) methacryl chloride ($CH_3(CH_2)C-C(O)Cl$) and 255 g (1.7 mol) 2,5-dimethyl-2,5-hexanediol. The mixture was stirred under nitrogen until the alcohol was dissolved. The stirred reaction was cooled to about −20 to −30° C. and 385 g (3.81 mol) triethylamine (TEA) was added over 5-20 minutes. The reaction mixture was stirred for an additional 30 minutes at −30° C. and then warmed up over night to room temperature without stirring. The reaction mixture was poured into deionized (DI) water and extracted twice with diethyl ether. The ether fraction washed twice with DI water and then the ether fraction was separated and dried over magnesium sulfate. The ether was stripped in a rotovap in a room temperature water bath. The analysis of the product gave the following results: 1H NMR (($CD3)_2C=O$) δ 6.02 (s, 2H, CH2=), 5.57 (s, 2H, CH2=), 1.93 (s, 4H, CH2CH2), 1.91 (s, 6H, =CCH3), 1.51 (s, 12H, C(CH3)2). 13C NMR (CDCl3) δ 167.0, 138.2, 124.8, 82.4, 35.2, 26.1, 18.6. IR (neat) 2978, 1713, 1636, 1473, 1369, 1332, 1175, 937 cm-1.

Synthesis Example 2 Preparation of methacrylate monomer, 3-hexyne-2,5-diol dimethacrylate A 1 liter four-neck round bottom flask was fitted with a stopped dropping funnel, thermometer and mechanical stirrer. After it was purged with nitrogen, the 1 liter flask was charged with 250 ml tetrahydrofuran (THF), 250 ml acetonitrile, 81 g (0.78 mol) methacryl chloride and 58 g 3-hexyne-2,5-diol. The mixture was stirred under nitrogen until the alcohol was dissolved. The stirred reaction was cooled to about −20 to −30° C. and 90 g (0.89 mol) triethylamine (TEA) was added over 5-20 minutes. The reaction mixture was stirred for an additional 30 minutes at −30° C. and then warmed up over night to room temperature without stirring. The reaction mixture was poured into deionized (DI) water and extracted twice with diethyl ether. The ether fraction washed twice with DI water and then the ether fraction was separated and dried over magnesium sulfate. The ether was stripped in a rotovap in a room temperature water bath. The analysis of the product gave the following results: 1H NMR δ 6.12 (s, 2H, CH2=), 5.90 (s, 2H, CH2=), 1.91 (s, 6H, =CCH3), 1.30 (s, 12H, C(CH3)2).

Examples 1-13 and Comparative Example 1

The copolymers/terpolymers and the identity of components used to produce various formulations described herein are disclosed in Table 1 and Table 2. Unless otherwise specified, all parts and percentage are by weight.

TABLE 1

| Polymer | Composition (molar percentage) | | | | | | Molecular Weight | Manufacturer |
| --- | --- | --- | --- | --- | --- | --- | --- | --- |
| | A | % | B | % | C | % | | |
| PolyGK55 | hydroxystyrene | 55 | t-butyl methacrylate | 45 | | | 11,500 | DuPont |
| PolyGK65 | hydroxystyrene | 65 | t-butyl methacrylate | 35 | | | 11,500 | DuPont |
| PolyGK81 | hydroxystyrene | 81 | t-butyl methacrylate | 19 | | | 11,000 | DuPont |
| PolyGIJ60 | hydroxystyrene | 60 | t-butyl acrylate | 20 | styrene | 20 | 11,000 | DuPont |
| PolyGIJ70 | hydroxystyrene | 70 | t-butyl acrylate | 15 | styrene | 15 | 11,900 | DuPont |
| PolyHM30 | hydroxystyrene | 30 | methyl methacrylate | 70 | | | 15,000 | DuPont |
| PolyHM55 | hydroxystyrene | 55 | methyl methacrylate | 45 | | | 17,000 | DuPont |
| PolyGIK67 | hydroxystyrene | 67 | t-butyl methacrylate | 16 | styrene | 17 | 11,000 | DuPont |
| PolyGIK70 | hydroxystyrene | 70 | t-butyl methacrylate | 10 | styrene | 20 | 12,000 | DuPont |
| VPT104s | hydroxystyrene | 75 | t-butoxystyrene | 25 | | | 10,000 | Nippon Soda |

TABLE 2

| Component | Name | Manufacturer |
| --- | --- | --- |
| Novolak | Cresol novolak resin | AZ ® Electronic Materials USA Corp. |
| SB404 | Aromatic acid acrylate half ester (55% in PGMEA) | Sartomer |
| Joncryl 611 | acrylic acid-styrene copolymer (MW = 8100) | Johnson Polymer |
| SR-214 | 1,4-butanediol dimethacrylate | Sartomer |
| CN371 | Amine modified acrylic oligomer | Sartomer |
| SR-268 | Tetraethylene glycol diacrylate | Sartomer |
| Irgacure 907 | 2-Methyl-1[4-(methylthio)phenyl]-2-morpholinopropan-1-one | Ciba Specialty |
| Irgacure 819 | Bis(2,4,6-trimethylbenzoyl)-phenylphosphineoxide | Ciba Specialty |
| ITX | Isopropylthioxanthone | Aldrich |
| Iconol TDA 9 | Tridecyl alcohol ethoxylate (9EO) | BASF |
| Kalle G-line dye | Dye | AZ ® Electronic Materials USA Corp. |
| TPSNf | Triphenylsulfonium triflate | Toyo Gosei |
| TAG 2359 | Dinonylnaphthalene monosulfonic acid salt | Kelly Chemical |
| Megaface R08 | Fluorosilicon modified nonionic surfactant (90% active in PGME) | Dainippon Ink Company |
| PGME | Propylene glycol methyl ether | Dow Chemical |
| PGMEA | Propylene glycol methyl ether acetate | Dow Chemical |

The photoresist compositions were formulated by mixing the components according to the formulations of Table 3 and 4. All the constituents were supplied at room temperature.

TABLE 3

| Component | Ex. 1 % | Ex. 2 % | Ex. 3 % | Ex. 4 % | Ex. 5 % | Ex. 6 % | Ex. 7 % | Ex. 8 % |
| --- | --- | --- | --- | --- | --- | --- | --- | --- |
| PolyGK65 | 23.79 | 27.01 | 23.79 | 22.71 | | | | |
| PolyGIJ60 | | | | | 31.03 | 29.39 | | 14.25 |
| PolyGIJ70 | | | | | | | 27.01 | 14.25 |
| SR-268 | 9.52 | 12.15 | 11.90 | 11.36 | 15.51 | 14.69 | 13.50 | 12.83 |
| DMHMA | 14.28 | 14.85 | 11.90 | 11.36 | 15.51 | 14.69 | 13.50 | 15.68 |
| Irgacure 907 | 2.38 | 2.70 | 2.38 | 4.54 | 3.10 | 5.88 | 2.70 | 4.28 |
| Irgacure 819 | 2.38 | 2.70 | 2.38 | 4.54 | 3.10 | 5.88 | 2.70 | 4.28 |
| Megafac R08 | 0.07 | 0.08 | 0.07 | 0.07 | 0.09 | 0.09 | 0.08 | 0.09 |
| PGMEA | 47.58 | 40.51 | 47.58 | 45.42 | 31.66 | 29.38 | 40.51 | 34.34 |
| Total | 100.00 | 100.00 | 100.00 | 100.00 | 100.00 | 100.00 | 100.00 | 100.00 |

TABLE 4

| Component | Ex. 9 % | Ex. 10 % | Ex. 11 % | Ex. 12 % | Ex. 13 % | Comp. Ex. 1 % |
|---|---|---|---|---|---|---|
| SB404 | | | | | | 39.48 |
| PolyGIK67 | 21.63 | | | | | |
| PolyGIK70 | | 27.01 | | | | |
| VPT104S | | | 27.01 | | | |
| PolyHM55 | | | | 27.01 | | |
| PolyHM30 | | | | | 27.01 | |
| SR-268 | 10.82 | 13.50 | 13.50 | 16.20 | 16.20 | 13.52 |
| DMHMA | 10.82 | 13.50 | 13.50 | 10.80 | 10.80 | |

TABLE 4-continued

| Component | Ex. 9 % | Ex. 10 % | Ex. 11 % | Ex. 12 % | Ex. 13 % | Comp. Ex. 1 % |
|---|---|---|---|---|---|---|
| Irgacure 907 | 2.16 | 2.70 | 2.70 | 2.70 | 2.70 | 2.31 |
| Irgacure 819 | 2.16 | 2.70 | 2.70 | 2.70 | 2.70 | |
| Megafac R08 | 0.06 | 0.08 | 0.08 | 0.08 | 0.08 | 0.07 |
| CN371 | | | | | | 0.81 |
| ITX | | | | | | 0.61 |
| Kelle G-Line Dye | | | | | | 0.05 |
| Iconol TDA 9 | | | | | | 0.35 |
| PGME | | | | | | 6.00 |
| PGMEA | 52.35 | 40.51 | 40.51 | 40.51 | 40.51 | 36.80 |
| Total | 100.00 | 100.00 | 100.00 | 100.00 | 100.00 | 100.00 |

The photoresist solutions from above were coated onto 6 inch silicon wafers and baked at 115° C. for 4-10 min to remove the solvents to achieve a film thickness of 20-60 microns. The coated wafers were exposed with a Carl Suss MA200 mask aligner at energy ranging from 500-2500 mJ/cm$^2$. The wafers were developed in an aqueous solution of a 0.261 N tetramethylammonium hydroxide developer.

The exposure energy required to retain the pattern on the mask was calculated for each sample. The film thicknesses before and after development were measured with a Foothill KT-22 film thickness measurement tool (available from Foothill Instruments, La Canada, Calif.) and film thickness loss was calculated. The results obtained are presented in Table 5. The wafer surface quality was checked under an optical microscope. In Table 5, the symbol "0" indicates that the photoresist surface was smooth and shiny due to insignificant dissolution in the developer, whilst the symbol "X" indicates that the surface was not smooth due to dissolution of photoresist in the developer. The side wall profile and adhesion to the substrate were evaluated according to SEM observations. The resolution was evaluated by calculating the ratio of film thickness/smallest feature retained. Results obtained are shown in Table 5.

TABLE 5

| | | Energy (mJ/cm$^2$) | Film Thickness Loss (%) | Surface Quality | Side Wall | Adhesion | Resolution | Compatibility with Cu plating |
|---|---|---|---|---|---|---|---|---|
| Example | 1 | 1000 | 8 | O | Straight | Good | >2 | |
| | 2 | 1000 | 8 | O | Straight | Good | >4 | |
| | 3 | 1000 | 8 | O | Straight | Good | >2 | |
| | 4 | 1000 | 8 | O | Straight | Good | >2 | |
| | 5 | 800 | 5 | O | Straight | Good | >4 | |
| | 6 | 800 | 5 | O | Straight | Good | >4 | Yes |
| | 7 | 1300 | 10 | O | Straight | Good | >2 | |
| | 8 | 1200 | 9 | O | Straight | Good | >4 | |
| | 9 | 1400 | 12 | X | Footing | Residues | | |
| | 10 | 1400 | 12 | X | Undercut | Medium | | |
| | 11 | 1500 | 10 | X | Undercut | Medium | | |
| | 12 | 2000 | 6 | O | Undercut | Medium | | |
| | 13 | 2000 | 5 | O | Undercut | Medium | | |
| Comparative Example | 1 | 600 | 3 | O | Straight | Bad | 1 | Yes |

Test for Copper Plating Compatibility

The photoresist of Example 6 was coated on a copper plated 6 inch silicon wafer, followed by drying on a hot plate at 115° C. for 5 min, to obtain a coating with a film thickness of 20 microns. The film coating was exposed with a Carl Suss MA200 mask aligner at energy of 1000 mJ/cm$^2$. The development was carried out with 0.261 N aqueous solution of tetramethylammonium hydroxide. The compatibility study between the photoresist and electrolyte (Microfab® Cu 200) was carried out to ensure that the electrolyte does not attack the photoresist under chemical and electrochemical conditions. No cracking and adhesion failure of photoresist were observed. Microfab® Cu 200 (from Enthone Inc. Orange, Conn. 06477) used as the electroplating solution. Plating Cu bumps was performed from a beaker with 2 cm×2 cm patterned wafers at current density of 4 Amps/decimeter$^2$ (ASD) for 30 min. Plated Cu structures varied in thickness with current density and plating times. After plating, the photoresist was removed with AZ 400T stripper available from AZ Electronic Materials USA Corps, Somerville, N.J. Plated Cu structures and cross sections of the resist sidewall profiles were evaluated by scanning electron micrographs (SEM) using AMRAY 4200L electron microscopes. The surface of the photoresist was smooth with no cracking, showing compatibility with the plating solution. Due to the similarity of the chemical structure of the base polymers, it can be expected that other photoresists of Example 1-5 and Examples 7 and 8 are also compatible with Cu plating solution.

SB404 oligomer was used to prepare the photoresist of Comparative Example 1. The same evaluation as above in Example 6 was done to evaluate the performance of the photoresist and the results are given in Table 5. The comparative example 1 photoresist showed less adhesion and lower resolution than the photoresists of Example 1-8, but was compatible with the copper plating solution.

Examples 14 to 18 and Comparative Example 2

Example 14-18, as shown in Table 6, show use of the additional secondary polymers to the photoresist formulation. The novolak content varied from 30% to 50% in base polymers for Example 14-17. In Example 18, the acrylic acid-styrene copolymer was 13.4% of the base polymers. The photoresists were formulated according to Table 6. The same lithographic evaluation as in Example 1-8 was made and the results were given in Table 7. The photoresists exhibited good lithographic performance although higher exposure energy was needed.

In Comparative Example 2, 100% novolak was used as the base polymer. The photoresist did not show good lithographic performance.

Example 19 to 21 and Comparative Example 3 and 4

The photoresist compositions were formulated according to Table 8. 0.28% TPSNf and 0.58% TAG 2359 were used in the formulation of Example 20 and 21, respectively, as shown in Table 8. No PAG or TAG was used in the formulation of Example 19. The photoresists were evaluated lithographically as in Example 1-8 and the results are shown in Table 9. Additionally, after development the patterned photoresist films of Example 19 and 20 were exposed under a Deep UV lamp at 130 mJ/cm$^2$ and followed by a postexposure bake of 80° C. for 30 seconds. The photoresist film of Example 20 was removed from the substrate after immersion in a 0.261 N aqueous solution of tetramethylammonium hydroxide at room temperature for 20 min. The photoresist film of Example 19 was retained on the substrate under the same conditions of stripping as Example 20. The patterned photoresist film of Example 21 was hard baked on a hot plate of 200° C. for 2 min and was removed from the substrate after immersion in a 0.261 N aqueous solution of tetramethylammonium hydroxide at room temperature for 20 min.

TABLE 6

| Component | Ex. 14 % | Ex. 15 % | Ex. 16 % | Ex. 17 % | Ex. 18 % | Comp. Ex. 2 % |
|---|---|---|---|---|---|---|
| PolyGK55 | | | 21.30 | 15.08 | | |
| PolyGK65 | 21.30 | | | | | |
| PolyGIJ60 | | 21.15 | | | 29.5 | |
| Joncryl611 | | | | | 4.6 | |
| novolak | 9.13 | 9.07 | 9.13 | 15.08 | | 29.29 |
| SR-268 | 12.17 | 13.60 | 13.68 | 15.08 | 14.7 | 8.79 |
| SR-214 | | | | | 14.7 | |
| DMHMA | 18.26 | 16.62 | 16.74 | 15.08 | | 20.5 |
| Irgacure 907 | 4.56 | 4.53 | 4.56 | 4.53 | 3.0 | 4.39 |
| Irgacure 819 | 3.04 | 3.02 | 3.04 | 3.02 | 3.0 | 4.39 |
| Megafac R08 | 0.09 | 0.09 | 0.09 | 0.09 | 0.11 | 0.09 |
| PGMEA | 31.45 | 31.92 | 31.46 | 32.04 | 30.4 | 32.55 |
| Total | 100.00 | 100.00 | 100.00 | 100.00 | 100.00 | 100.00 |

TABLE 8

| Component | Ex. 19 % | Ex. 20 % | Ex. 21 % | Comp. Ex. 3 % | Comp. Ex. 4 % |
|---|---|---|---|---|---|
| PolyGK65 | | | | 23.74 | |
| PolyGIJ70 | 27.37 | 28.07 | 28.79 | | |
| PolyGK81 | | | | | 20.73 |
| SR-268 | 12.32 | 12.63 | 12.96 | 14.24 | 10.37 |
| DMHMA | 15.06 | 15.44 | 15.84 | 9.49 | 10.37 |
| Irgacure 907 | 4.11 | 4.21 | 4.32 | 2.37 | 3.11 |
| Irgacure 819 | 2.74 | 2.81 | 2.88 | 2.37 | 3.11 |
| TPSNf | | 0.28 | | 0.24 | 0.41 |
| TAG2396 | | | 0.58 | | |
| Megafac R08 | 0.08 | 0.08 | 0.09 | 0.07 | 0.06 |
| PGMEA | 38.32 | 36.48 | 34.54 | 47.48 | 51.84 |
| Total | 100.00 | 100.00 | 100.00 | 100.00 | 100.00 |

TPSNf—Triphenylsulfonium nonaflate
TAG 2396—Dinonylnaphthalene monosulfonic acid salt

TABLE 7

| | | Energy (mJ/cm$^2$) | Film Thickness Loss (%) | Surface Quality | Side Wall | Adhesion | Resolution |
|---|---|---|---|---|---|---|---|
| Example | 14 | 1500 | 6 | ○ | Straight | Good | >4 |
| | 15 | 1200 | 5 | ○ | Straight | Good | >4 |
| | 16 | 1000 | 5 | ○ | Straight | Good | >4 |
| | 17 | 1500 | 7 | ○ | Straight | Good | >4 |
| | 18 | 1000 | 5 | ○ | Straight | Good | >4 |
| Comparative Example | 2 | 2500 | 12 | X | Footing | Residues | / |

TABLE 9

|  |  | Energy (mJ/cm$^2$) | Film Thickness Loss (%) | Surface Quality | Side Wall | Adhesion | Resolution | Stripped in developer |
|---|---|---|---|---|---|---|---|---|
| Example | 19 | 1300 | 10 | ○ | Straight | Good | >2 | No |
|  | 20 | 1500 | 11 | ○ | Straight | Good | >2 | Yes |
|  | 21 | 2000 | 11 | ○ | Straight | Good | >2 | Yes |
| Comparative Example | 3 | 1000 | 7 | ○ | Straight | Good | >2 | Yes |
|  | 4 | 2500 | 12 | X | Footing | Fair | >1 | Yes |

In Comparative Example 3 and 4, 0.24% and 0.41% TPSNf were mixed in the formulation, as shown in Table 8. The same lithographic evaluation as Example 20 was done for Comparative Example 3 and 4, and the results are given in Table 9. After the Deep UV exposure and postexposure bake, the photoresist film of Comparative Example 3 was immersed in a 0.261 N aqueous solution of tetramethylammonium hydroxide, and the photoresist film was removed from the substrate in 40 minutes. In Comparative Example 4, the photoresist film was removed from the substrate in 0.261 N aqueous solution of tetramethylammonium hydroxide after Deep UV exposure and PEB. However, the lithographic evaluation of Comparative Example 4 showed undesirable footing.

The invention claimed is:

1. A negative photoresist composition comprising;
    a) at least one alkali-soluble polymer, where the polymer comprises at least one unit of structure 1,

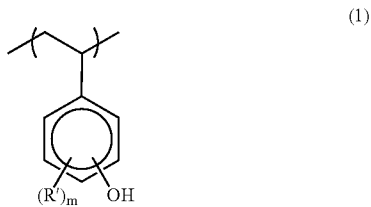

(1)

where, R' is selected independently from hydrogen, (C$_1$-C$_4$)alkyl, chlorine and bromine, and m is an integer from 1 to 4;
    b) at least one monomer of structure 4;

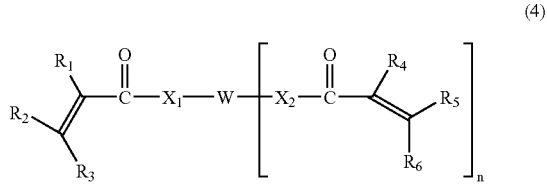

(4)

where, W is a multivalent linking group, R$_1$ to R$_6$ are independently selected from hydrogen, hydroxy, (C$_1$-C$_{20}$) alkyl and chlorine, X$_1$ and X$_2$ are independently oxygen and n is an integer equal to or greater than 1; and,
    c) at least one photoinitiator,
    and, further where the monomer of structure 4 comprises an acid-cleavable group and the alkali-soluble polymer further comprises an acid-cleavable group.

2. The composition according to claim 1, where the unit of structure 1 is derived from a monomer selected from 3-hydroxystyrene, 4-hydroxystyrene, 3-methyl-4-hydroxystyrene, 3,5-dimethyl-4-hydroxystyrene, and 3,5-dibromo-4-hydroxystyrene.

3. The composition according to claim 1, where the alkali soluble polymer further comprises at least one additional monomeric unit.

4. The composition of claim 3, where the additional monomeric unit is derived from a monomer selected from methyl (meth)acrylate, n-butyl (methacrylate), phenyl(methacrylate), benzyl(methacrylate), styrene, hydroxystyrene with an acid cleavable group, an ethylene comonomer with an acid cleavable group, and norbornene derivative with an acid cleavable group.

5. The composition of claim 1, where the acid cleavable group of the monomer isselected from C(O)—O—C, C—O—C and C—O—Si.

6. The composition of claim 1, where the multivalent linking group, W, is selected from at least one of a polymer, (C$_1$-C$_{20}$) alkylene and (C$_2$-C$_3$) alkoxylated (C$_1$-C$_{20}$) alkylene.

7. The composition of claim 1, where in structure 4, n ranges from 1 to 7.

8. The composition of claim 1, where the compound of structure 4 is a di(meth)acrylate monomer.

9. The composition of claim 1, where the photoinitiator is at least one of 1-hydroxy cyclohexyl phenyl ketone, 2,2-dimethoxy-1,2-diphenylethan-1-one, bis(2,4,6-trimethylbenzoyl)phenylphosphineoxide, 1-[4-(2-hydroxyethoxy)phenyl]-2-hydroxy-2-methyl-1-propane-1-one, 2-benzyl-2-dimethylamino-1-(4-morpholinophenyl)butanone, 2-methyl-1-[4-(methylthio)phenyl]-2-morpholinopropan-1-one, and 2-hydroxy-2-methyl-1-phenyl propan-1-one.

10. The composition of claim 1, further comprising a secondary polymer.

11. The composition of claim 10, where the secondary polymer is selected from unsubstituted or substituted (meth)acrylic acid containing polymers or copolymers, unsubstituted or substituted (meth)acrylate containing polymers or copolymers, unsubstituted or substituted vinyl ester containing polymers or copolymers, unsubstituted or substituted vinyl aromatic containing polymers or copolymers, (meth)acrylic acid-styrene copolymers and novolak polymers.

12. The composition of claim 1, capable of forming a film with a thickness in the range of about 2 microns to about 200 microns.

13. A process for imaging a negative photoresist comprising the steps of,
    a) forming a layer of photoresist coating from the composition of claim 1 on a substrate;
    b) imagewise exposing the photoresist with an exposure equipment; and,
    d) developing the coating with a developer.

14. The process of claim 13, where the photoresist coating has a film thickness in the range of about 2 microns to about 200 microns.

15. The process according to claim 13 where radiation for imagewise exposure has wavelength(s) greater than 200 nm.

16. The process of claim 13, further comprising a step of removing the photoresist coating from the substrate.

17. The process of claim 16, where the removing step comprises heating the photoresist coating after the developing step, and removing the photoresist coating from the substrate in an aqueous alkaline solution.

18. The process of claim 13, further comprising exposing the photoresist coating after the developing step.

19. The process of claim 13, where the developer comprises an aqueous solution comprising at least one compound selected from tetramethyl ammonium hydroxide, sodium hydroxide and potassium hydroxide.

20. The composition of claim 1, where the acid cleavable group of the monomer comprises a tertiary carbon atom adjacent to $X_1$ and/or $X_2$.

21. The composition of claim 1, further comprising a thermal acid generator and/or a photoacid generator.

22. A negative photoresist composition comprising:
   a) at least one alkali-soluble polymer, where the polymer comprises at least one unit of structure 1,

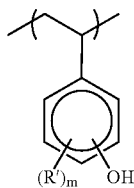

(1)

where, R' is selected independently from hydrogen, ($C_1$-$C_4$) alkyl, chlorine and bromine, and m is an integer from 1 to 4;
   b) at least one monomer selected from 2,5-dimethyl-2,5-hexanediol di(methacrylate) and 2,5-dimethyl-2,5-hex-3-yne-diol di(methacrylate) and c) at least one photoinitiator.

23. A negative photoresist composition comprising:
   a) at least one alkali-soluble polymer, where the polymer comprises at least one unit of structure 1,

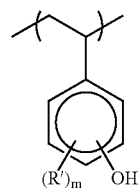

(1)

where, R' is selected independently from hydrogen, ($C_1$-$C_4$) alkyl, chlorine and bromine, and m is an integer from 1 to 4;
   b) at least one monomer of structure 4;

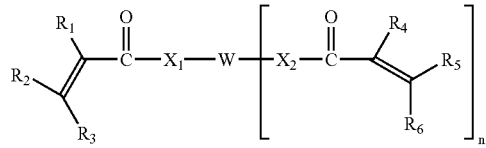

(4)

where, W is a multivalent linking group, $R_1$ to $R_6$ are independently selected from hydrogen, hydroxy, ($C_1$-$C_{20}$) alkyl and chlorine, $X_1$ and $X_2$ are independently oxygen and n is an integer equal to or greater than 1; and,
   c) at least one photoinitiator,
and, further where the alkali-soluble polymer further comprises an acid-cleavable group, and/or the monomer of structure 4 comprises an acid-cleavable group, and further where the composition comprises a thermal acid generator and/or a photoacid generator.

* * * * *